United States Patent
Qiao et al.

(10) Patent No.: US 12,152,186 B2
(45) Date of Patent: Nov. 26, 2024

(54) GROUP II-III-V-VI QUANTUM DOT, PREPARATION METHOD THEREFOR AND QUANTUM DOT OPTOELECTRONIC DEVICE

(71) Applicant: Najing Technology Corporation Limited, Zhejiang (CN)

(72) Inventors: Peisheng Qiao, Zhejiang (CN); Jun Wang, Zhejiang (CN); Wenhua Yu, Zhejiang (CN)

(73) Assignee: Najing Technology Corporation Limited, Zhejiang (CN)

( * ) Notice: Subject to any disclaimer, the term of this patent is extended or adjusted under 35 U.S.C. 154(b) by 608 days.

(21) Appl. No.: 17/606,061

(22) PCT Filed: Apr. 23, 2020

(86) PCT No.: PCT/CN2020/086244
§ 371 (c)(1),
(2) Date: Oct. 25, 2021

(87) PCT Pub. No.: WO2020/216265
PCT Pub. Date: Oct. 29, 2020

(65) Prior Publication Data
US 2022/0220376 A1    Jul. 14, 2022

(30) Foreign Application Priority Data
Apr. 26, 2019  (CN) .................. 201910345254.X

(51) Int. Cl.
*C09K 11/70*  (2006.01)
*B82Y 20/00*  (2011.01)
(Continued)

(52) U.S. Cl.
CPC .......... *C09K 11/703* (2013.01); *C01G 15/006* (2013.01); *C09K 11/565* (2013.01);
(Continued)

(58) Field of Classification Search
CPC ... C09K 11/883; C09K 11/703; C09K 11/565; C09K 11/623; C01G 15/006; H10K 50/115
See application file for complete search history.

(56) References Cited

U.S. PATENT DOCUMENTS

2014/0322901 A1    10/2014   Huang et al.

FOREIGN PATENT DOCUMENTS

CN    101765649 A    6/2010
CN    102199425 A    9/2011
(Continued)

OTHER PUBLICATIONS

Huang, Lu, et al.; <Synthesis of InPZnS/ZnS Quantum Dots by Continuous Injection of Phosphorus Precursor>; «Acta Chim. Sinica»;Mar. 31, 2017; p. 301-304; vol. 75; No. 3. ISSN:0567-7351.
(Continued)

*Primary Examiner* — C Melissa Koslow
(74) *Attorney, Agent, or Firm* — Samson G. Yu

(57) ABSTRACT

Disclosed by the present disclosure are Group II-III-V-VI quantum dots, preparation method therefore and quantum dot optoelectric device. The method for preparing Group II-III-V-VI quantum dots includes the following steps: S1, providing a first solution containing Group III-V quantum dot cores, or providing a second solution containing II-III-V quantum dot cores; S2, adding a second supplementary liquid to the first solution, or adding a first supplementary liquid to the second solution, and reacting to obtain Group II-III-V-VI quantum dot cores; wherein reacting a first mixture including a precursor of a first Group III element, a precursor of a first Group V element and a solvent at a temperature of 40~100° C. and then adding a precursor of a first Group VI element and reacting to obtain the first supplementary liquid; or reacting a second mixture includ-
(Continued)

ing a precursor of a first Group II element, a first Group III element, a precursor of a first Group V element and a solvent at a temperature of 40~100° C. and then adding a precursor of a first Group VI element and reacting to obtain the second supplementary liquid.

20 Claims, 2 Drawing Sheets

(51) Int. Cl.
      *B82Y 30/00*       (2011.01)
      *B82Y 40/00*       (2011.01)
      *C01G 15/00*       (2006.01)
      *C09K 11/56*       (2006.01)
      *C09K 11/62*       (2006.01)
      *C09K 11/88*       (2006.01)
      *H10K 50/115*       (2023.01)
      *H10K 102/00*       (2023.01)
(52) U.S. Cl.
      CPC .......... *C09K 11/623* (2013.01); *C09K 11/883* (2013.01); *B82Y 20/00* (2013.01); *B82Y 30/00* (2013.01); *B82Y 40/00* (2013.01); *C01P 2004/64* (2013.01); *C01P 2006/60* (2013.01); *H10K 50/115* (2023.02); *H10K 2102/00* (2023.02)

(56) References Cited

FOREIGN PATENT DOCUMENTS

| | | |
|---|---|---|
| CN | 105051153 A | 11/2015 |
| CN | 105992807 A | 10/2016 |
| CN | 106479482 A | 3/2017 |
| CN | 106701059 A | 5/2017 |
| CN | 109439327 A | 3/2019 |
| KR | 101768998 B1 | 8/2017 |
| WO | 2018146120 A | 8/2018 |
| WO | 2018215396 A | 11/2018 |

OTHER PUBLICATIONS

Kim Taehoon et al; <Large-scale Synthesis of InPZnS Alloy Quantum Dots with Do-decanethiol as a Composition Controller>; «The journal of Physical Chemistry Letters»; vol. 3; No. 2; Dec. 26, 2011; p. 214-218.

Altintas Yemliha et al.; The Effect of Ligand Chain Length on the Optical Properties of Alloyed Core-Shell nPZnS/ZnS Quantum Dots, «Journal Of Alloys and Compounds»; vol. 711; Mar. 29, 2017; p. 1873-4669.

Altintas Yemliha et al.; <Highly Efficient Cd-Free Alloyed Core/Shell Quantum Dots with Optimized Precursor Concentrations>; «Journal Of Physical Chemistry C»; vol. 120; No. 14; Mar. 17, 2016; p. 7885-7892.

GROUP II-III-V-VI QUANTUM DOT, PREPARATION METHOD THEREFOR AND QUANTUM DOT OPTOELECTRONIC DEVICE

CROSS REFERENCE TO RELATED APPLICATIONS

This application is a national application of PCT/CN2020/086244, filed on Apr. 23, 2020. The contents of PCT/CN2020/086244 are all hereby incorporated by reference.

TECHNICAL FIELD

The disclosure relates to the technical field of quantum dot materials, in particular to a II-III-V-VI Group quantum dot, a preparation method thereof and a quantum dot optoelectronic device.

BACKGROUND

Quantum dot material is an inorganic material with a nanometer size, which has excellent luminescence properties and has broad application prospects in the fields of display, lighting, biology and so on. Compared with luminescent materials such as phosphors, quantum dot has the advantages of adjustable luminescence range, narrow photoluminescence full width at half maximum, high quantum efficiency, and strong stability. Considering environmental protection factors, the application of current cadmium-containing quantum dot material is greatly restricted, and cadmium-free quantum dot represented by indium phosphide is the focus of research and development in recent years. The nucleation process of indium phosphide has the characteristics of covalent bonding, fast nucleation, and many lattice defects, which lead to a wider photoluminescence full width at half maximum and lower quantum efficiency. In particular, red quantum dots require a large nucleation size, which further increases the difficulty of their preparation. In addition, because intrinsic indium phosphide has many lattice defects leading to low quantum efficiency, so it is necessary to coat the quantum dot core with a shell layer to improve the photoluminescence performance. However, the lattice mismatch between the Group III-V InP quantum dot and the commonly used Group II-VI ZnSe or ZnS shell layer is relatively high, resulting in poor coating effect.

Since it is difficult to nucleate large particles of InP in one step, it is usually necessary to add precursor again to promote the growth of the core in the follow-up step. The prior art of preparation of InP, especially red InP, mainly involves supplementally adding an indium precursor, an phosphorus precursor or small-size InP particles to the initial InP cores to form large particles of InP. However, it has the following shortcomings: firstly, the supplementary liquid tends to cause self-nucleation, forming small particles of InP, which affects the growth rate and uniformity of InP, secondly, due to the structure of InP, the initial cores of InP grow inhomogeneously in the supplementary liquid and generate many lattice defects, resulting in poor uniformity of the prepared InP, and poor photoluminescence performance after subsequent coating.

The prior art also involves the preparation of InZnPS, but most of preparation methods belong to one-pot method. The disadvantages of the one-pot method are that the prepared InZnPS quantum dots have many lattice defects and poor optical performance, it is difficult to dope S of Group VI elements into the quantum dots due to multiple elements and complex structure. Therefore, full width at half maximum of the photoluminescence peak is wide and the quantum efficiency is low.

SUMMARY

In order to overcome the shortcomings of the prior art, the purpose of the present disclosure is to provide a Group II-III-V-VI quantum dot with fewer lattice defects and excellent optical performance, preparation method thereof, and a quantum dot optoelectronic device.

According to one aspect of the present disclosure, there is provided a Group II-III-V-VI quantum dot, including a quantum dot core, wherein the quantum dot core is InZnPS or InZnPSe, an ultraviolet absorption peak wavelength of the quantum dot core is greater than or equal to 570 nanometers and less than or equal to 610 nanometers, and a half width at half maximum of the ultraviolet absorption peak of the quantum dot core is greater than or equal to 22 nanometers and less than or equal to 24 nanometers.

Further, a size of the quantum dot core is greater than or equal to 4 nanometers and less than or equal to 5 nanometers.

Further, the quantum dot further includes a shell layer coating the quantum dot core, the shell layer being selected from one or more of ZnSe, ZnS and ZnSeS, and a photoluminescence emission peak wavelength of the Group II-III-V-VI quantum dot is greater than or equal to 610 nanometers and less than or equal to 650 nanometers, and the photoluminescence full width at half maximum of the Group II-III-V-VI quantum dot is greater than or equal to 37 nanometers and less than or equal to 39 nanometers.

According to another aspect of the present disclosure, there is provided a method for preparing Group II-III-V-VI quantum dots, including the following steps:
S1, providing a first solution containing Group III-V quantum dot cores, or providing a second solution containing Group II-III-V quantum dot cores;
S2, adding a second supplementary liquid to the first solution, or adding a first supplementary liquid to the second solution, and reacting to obtain Group II-III-V-VI quantum dot cores;
wherein, a preparation method of the first supplementary liquid includes: reacting a first mixture including a precursor of a first Group III element, a precursor of a first Group V element and a solvent at a temperature of 40~100° C., and then adding a precursor of a first Group VI element and reacting to obtain the first supplementary liquid; or
a preparation method of the second supplementary liquid includes: reacting a second mixture including a precursor of a first Group II element, a precursor of a first Group III element, a precursor of a first Group V element and a solvent at a temperature of 40~100° C., and then adding a precursor of a first Group VI element and reacting to obtain the second supplementary liquid.

Further, the reaction temperature of step S2 is 250~300° C.

Further, the Group III-V quantum dot cores are InP, and the Group II-III-V quantum dot cores are InZnP.

Further, in the first supplementary liquid, a mole ratio of the first Group III element with respect to the first Group V element is greater than or equal to 1:1 and less than or equal to 10:1, and a mole ratio of the first Group III element with respect to the first Group VI element is greater than or equal to 1:2 and less than or equal to 5:1.

Further, in the second supplementary liquid, a mole ratio of the first Group III element with respect to the first Group II element is greater than or equal to 1:5 and less than or equal to 10:1, a mole ratio of the first Group III element with respect to the first Group V element is greater than or equal to 1:1 and less than or equal to 10:1, and a mole ratio of the first Group III element with respect to the first Group VI element is greater than or equal to 1:2 and less than or equal to 5:1.

Further, the precursor of the first Group II element is a zinc precursor, the precursor of the first Group III element is an indium precursor, the precursor of the first Group V element is a phosphorus precursor, and the precursor of the first Group VI element is one of a selenium precursor and a sulfur precursor.

Further, the first mixture or the second mixture further includes a ligand, and the ligand is selected from one or more of trioctylamine, trioctylphosphine, tributylphosphine, dioctylamine and octylamine.

Further, after the step S2, it further includes the following step: purifying the Group II-III-V-VI quantum dot cores of the step S2 and dissolving them in a solvent, adding a precursor of a second Group II element and a precursor of a second Group VI element to a solution containing the Group II-III-V-VI quantum dot cores, reacting for a period of time to coat the Group II-III-V-VI quantum dot core with a Group II-VI shell layer, and then purifying the prepared quantum dots from the solution.

Further, the precursor of the second Group II element is a zinc precursor, and the precursor of the second Group VI element is one of a sulfur precursor, a selenium precursor and a selenium-sulfur mixed precursor.

According to another aspect of the present disclosure, there is provided a quantum dot optoelectronic device. The quantum dot optoelectronic device includes the above-mentioned Group II-III-V-VI quantum dot or the quantum dots prepared by the above-mentioned method for preparing Group II-III-V-VI quantum dots.

Compared with the prior art, the present disclosure has the beneficial effects that the Group II-III-V-VI quantum dot prepared by the present disclosure has high uniformity, fewer lattice defects, and excellent optical performance.

BRIEF DESCRIPTION OF THE DRAWINGS

The accompanying drawings that constitute a part of this disclosure are used to provide a further understanding of this disclosure. The schematic embodiments and descriptions thereof of this disclosure are used to explain this disclosure and do not constitute an improper limitation of this disclosure. In the drawings.

DETAILED DESCRIPTION

Figure 1:
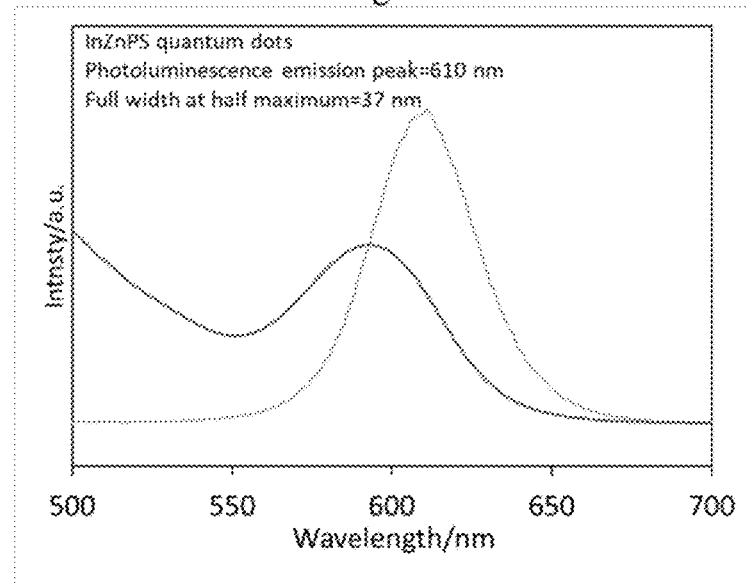
FIG. 1 shows the ultraviolet absorption and photoluminescence emission spectra of the InZnPS quantum dot cores of Example 1.

In the following, the present disclosure will be further described in combination with specific embodiments. It should be noted that the embodiments of the present disclosure and the features of the embodiments may be combined with each other in case of no conflict.

It should be noted that the terms "first", "second", and the like in the specification and claims of the present disclosure are used to distinguish similar objects, and are not necessarily used to describe a particular order or sequence. It should be understood that the number so used may be interchangeable when appropriate to facilitate the description of embodiments of the invention disclosed herein. Furthermore, the terms "include" and "have", as well as any variants thereof, are intended to cover a non-exclusive inclusion, for example, processes, methods, systems, products, or devices that include a series of steps or units are not necessarily limited to include those steps or units explicitly listed, and may include other steps or units not explicitly listed or inherent to such processes, methods, products or devices.

It should be noted that the core and the shell may have an interface, and an element of at least one of the core or the shell in the interface may have a concentration gradient wherein the concentration of the element(s) of the shell decreases toward the core. The shell and the adjacent shell may have an interface, and the interface may include an element of at least one of the two shells.

The disclosure provides a method for preparing Group II-III-V-VI quantum dots, which includes the following steps:

S1, providing a first solution containing Group III-V quantum dot cores, or providing a second solution containing Group II-III-V quantum dot cores;

S2, adding a second supplementary liquid to the first solution, or adding a first supplementary liquid to the second solution, and reacting to obtain Group II-III-V-VI quantum dot cores;

wherein, a preparation method of the first supplementary liquid includes: reacting a first mixture including a precursor of a first Group III element, a precursor of a first Group V element and a solvent at a temperature of 40~100° C., and then adding a precursor of a first Group VI element and reacting to obtain the first supplementary liquid; or a preparation method of the second supplementary liquid includes: reacting a second mixture including a precursor of a first Group II element, a precursor of a first Group III element, a precursor of a first Group V element and a solvent at a temperature of 40~100° C., and then adding a precursor of a first Group VI element and reacting to obtain the second supplementary liquid.

The disclosure solves the problem that the Group VI element is difficult to dope into the quantum dot when the Group II-III-V-VI quantum dot is synthesized by the one-pot method. The preparation method provided by the present disclosure is to introduce the Group VI element into the supplementary liquid. The supplementary liquid obtained by reacting at a lower temperature may include Group II-III-V-VI (in some embodiments may also be Group III-V-VI) small particle complexes, and the complexes in the supplementary liquid may continuously decompose and grow on the quantum dot cores in the solution after adding the above-mentioned supplementary liquid containing small particle complexes to the solution containing Group III-V quantum dot cores or Group II-III-V quantum dot cores, the II-III-V-VI quantum dot cores are finally obtained. The growth rate and uniformity of the quantum dots can be adjusted by controlling the addition amount and the addition speed of the supplementary liquid, and at the same time the Group VI element is introduced into the quantum dot cores, the introduction of the Group VI element is conducive to optimizing the lattice structure of the quantum dot cores and reducing lattice defects.

In the preparation methods of the first supplementary liquid and the second supplementary liquid, low temperature is beneficial to the formation of small particle complexes, but if the temperature is extremely low, the mixture may become turbid and precipitate solids, so it is appropriate to choose 40~100° C. for the reaction.

In some embodiments, the reaction temperature of step S2 is 250~300° C., and the high temperature may be beneficial to the decomposition of the complexes in the supplementary liquid to grow onto the quantum dot cores of the solution.

The Group III-V quantum dot cores in the present disclosure can be but not limited to InP, and the Group II-III-V quantum dot cores can be but not limited to InZnP.

The ultraviolet absorption peak positions of the Group III-V quantum dot cores and the Group II-III-V quantum dot cores in step S1 are between 430 nm and 530 nm. The preparation methods of the Group III-V quantum dot cores and the Group II-III-V quantum dot cores can refer to the prior art, and the preparation method is not limited in the present disclosure.

In some embodiments, in the first supplementary liquid, a mole ratio of the first Group III element with respect to the first Group V element is greater than or equal to 1:1 and less than or equal to 10:1, and a mole ratio of the first Group III element with respect to the first Group VI element is greater than or equal to 1:2 and less than or equal to 5:1.

In some embodiments, in the second supplementary liquid, a mole ratio of the first Group III element with respect to the first Group II element is greater than or equal to 1:5 and less than or equal to 10:1, a mole ratio of the first Group III element with respect to the first Group V element is greater than or equal to 1:1 and less than or equal to 10:1, and a mole ratio of the first Group III element with respect to the first Group VI element is greater than or equal to 1:2 and less than or equal to 5:1.

In some embodiments, the precursor of the first Group II element is a zinc precursor, the precursor of the first Group III element is an indium precursor, the precursor of the first Group V element is a phosphorus precursor, and the precursor of the first Group VI element is one of a selenium precursor and a sulfur precursor. The zinc precursor can be but not limited to zinc carboxylate; the indium precursor can be but not limited to indium carboxylate; the phosphorus precursor can be but not limited to tris(trimethylsilyl)phosphine; the selenium precursor can be but not limited to one and more of trisoctylphosphine selenium, tributylphosphine selenium, octadecene-selenium, Se-ODE suspension and tris(trimethylsilyl)selenium; the sulfur precursor can be but not limited to one and more of trioctylphosphine sulfide, tributyl phosphine sulfur, octadecene-sulfur, alkyl mercaptan and tris(trimethylsilyl)sulfur.

In some embodiments, the first mixture or the second mixture further includes a ligand, and the ligand can be but not limited to one and more of trioctylamine, trioctylphosphine, tributylphosphine, dioctylamine, and octylamine. The ligand can adjust the formation speed of small particle complexes of InZnPS in the supplementary liquid, control the size and uniformity of the complexes, and can also improve its stability during the storage and use of the supplementary liquid.

In some embodiments, an ultraviolet absorption peak wavelength of the quantum dot cores prepared by the present disclosure is greater than or equal to 570 nanometers and less than or equal to 610 nanometers, and half width at half maximum of the ultraviolet absorption peak of the quantum dot cores is greater than or equal to 22 nanometers and less than or equal to 24 nanometers.

In some embodiments, the size of the II-III-V-VI Group quantum dot cores prepared by the present disclosure is greater than or equal to 4 nanometers and less than or equal to 5 nanometers, and the above-mentioned size can be understood as the average size of the quantum dot cores.

Further, after step S2, the following steps can be included: S3, purifying the Group II-III-V-VI quantum dot cores of the step S2 and dissolving it in a solvent, adding a precursor of a second Group II element and a precursor of a second Group VI element to a solution containing the Group II-III-V-VI quantum dot cores, reacting for a period of time to coat the Group II-III-V-VI quantum dot core with a Group II-VI shell layer, and then purifying the prepared quantum dots from the solution.

The Group II-III-V-VI quantum dot core has a good lattice match with the Group II-VI shell layer, and the core-shell quantum dot formed after the shell layer has excellent photoluminescence performance.

In some embodiments, the second Group II element precursor is a zinc precursor, and the second Group VI element precursor is one of a sulfur precursor, a selenium precursor, and a selenium-sulfur mixed precursor.

In some embodiments, the Group II-III-V-VI/II-VI core-shell quantum dots prepared by the present disclosure have a photoluminescence emission peak wavelength of 610 nm to 650 nm, a photoluminescence full width at half maximum of 37 to 39 nm, and a quantum efficiency of more than or equal to 70%.

The present disclosure also provides a quantum dot optoelectronic device, which includes the Group II-III-V-VI quantum dots prepared by the present disclosure. The quantum dot optoelectronic device can be an OLED device, a QLED device, an LED device, a quantum dot laser, a quantum dot infrared light detector, a quantum dot single photon emitting device, and the like.

EMBODIMENTS

Example 1

(1) Synthesis of InZnPS supplementary liquid: 0.8 mmol In(MA)$_3$ (indium myristate), 0.5 mmol Zn(MA)$_2$ (zinc myristate), 0.5 mmol TMS-P (tris(trimethylsilyl)phosphine), 0.7 mmol trioctylamine and 15.0 g octadecene were added to a 100 mL three-necked flask, and the three-necked flask was heated to 70° C. under N$_2$ venting. The reaction temperature was kept at 70° C. for 30 minutes, and then 0.4 mmol S-ODE was added. The reaction was continued for 10 minutes, and then dropped to room temperature to obtain an InZnPS supplementary liquid.

(2) Synthesis of InZnPS quantum dot cores: 0.3 mmol In(Ac)$_3$ (indium acetate), 1.1 mmol myristic acid and 10.0 g octadecene were added to a 100 mL three-necked flask, and the three-necked flask was heated to 180° C. under N$_2$ venting. The reaction temperature was kept at 180° C. for 30 minutes and then dropped to room temperature. A mixture of 0.2 mmol TMS-P (tris(trimethylsilyl)phosphine) and 0.3 mmol trioctylamine was quickly injected, and then the temperature was raised to 300° C. After reacting at 300° C. for 5 minutes, the InP core solution was obtained. After keeping the reaction temperature at 300° C., the InZnPS supplementary liquid was slowly added to the InP core solution dropwise at a rate of 5 mL/h. After the dropping was completed, the mixed solution was reduced to room temperature. The mixed solution containing InZnPS quantum dots was extracted twice with methanol, precipitated with acetone and centrifuged, and the precipitate was dissolved in ODE (octadecene) to obtain the InZnPS quantum dot solution, which was subjected to absorption spectrum, photoluminescence emission spectrum and electron microscopy tests. FIG. 1 shows the ultraviolet absorption and photoluminescence emission spectra of the InZnPS quantum dot cores of Example 1.

Figure 2:
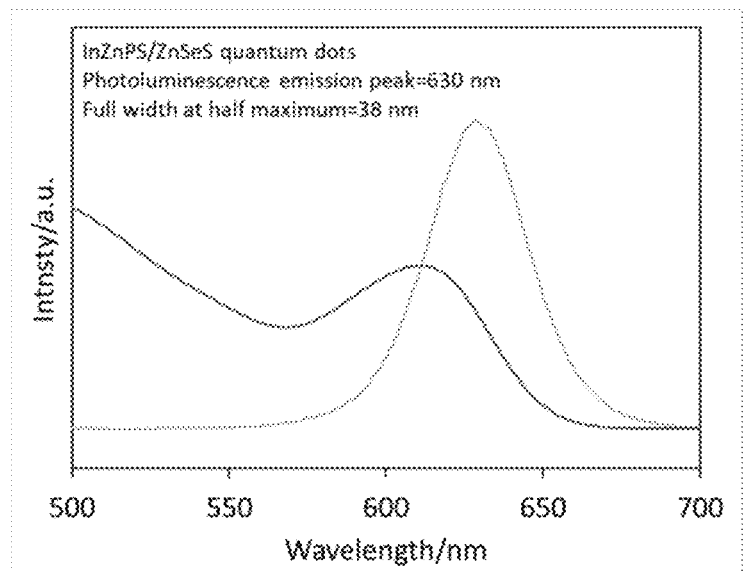
FIG. 2 shows the ultraviolet absorption and photoluminescence emission spectra of the InZnPS/ZnSeS core-shell quantum dots of Example 1.
Figure 3:
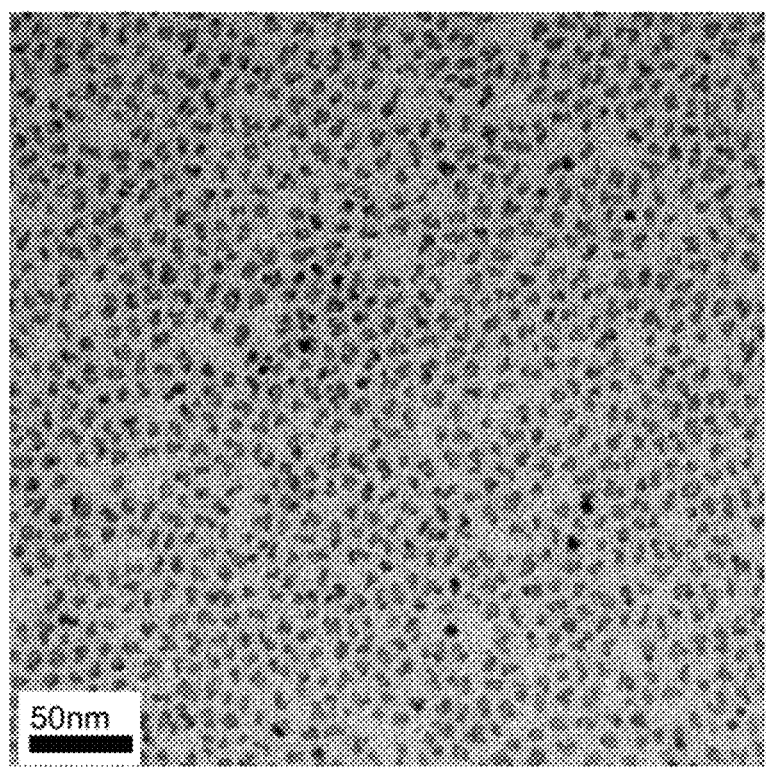
FIG. 3 shows the transmission electron micrograph of the InZnPS/ZnSeS core-shell quantum dots of Example 1.

(3) Synthesis of core-shell quantum dots: 0.8 mmol zinc stearate, 2.4 mmol oleic acid, 0.5 mmol trioctylphosphine and 20.0 g octadecene were added to a 100 mL three-necked flask, and the three-necked flask was heated to 180° C. under $N_2$ venting. The reaction temperature was kept at 180° C. for 30 minutes and then increased to 300° C. The InZnPS quantum dot solution was injected and reacted for 10 minutes, then 0.3 mmol Se-TOP (selenium-trioctylphosphine) and 0.5 mmol S-TOP (sulfur-trioctyl phosphine) were added and reacted at 300° C. for 30 min, and then dropped to room temperature to obtain a product system containing InZnPS/ZnSeS. The product system was extracted twice with methanol, precipitated with acetone and centrifuged, and the precipitate was dissolved in toluene, the InZnPS/ZnSeS quantum dot solution was obtained, and the absorption spectrum, photoluminescence emission spectrum and transmission electron microscope tests were performed. FIG. 2 is the ultraviolet absorption and photoluminescence emission spectra of the InZnPS/ZnSeS core-shell quantum dots of Example 1. FIG. 3 is an electron micrograph of the InZnPS/ZnSeS core-shell quantum dots of Example 1.

Example 2

The difference between Example 2 and Example 1 lies in the step (1) the synthesis of InZnPS supplementary liquid, while the step (2) and step (3) are the same.

The synthesis of InZnPS supplementary liquid in Example 2: 0.5 mmol In(MA)$_3$ (indium myristate), 0.3 mmol Zn(MA)$_2$ (zinc myristate), 0.4 mmol TMS-P (tris(trimethylsilyl) phosphine), 0.5 mmol trioctylamine and 10.0 g octadecene were added to a 100 mL three-necked flask, and the three-necked flask was heated to 40° C. under $N_2$ venting. The reaction temperature was kept at 40° C. for 30 minutes, and then 0.2 mmol S-ODE was added. The reaction was continued for 10 minutes, and then dropped to room temperature to obtain an InZnPS supplementary liquid.

Example 3

The difference between Example 3 and Example 1 lies in the step (1) the synthesis of InZnPS supplementary liquid, while step (2) and step (3) are the same.

The synthesis of InZnPS supplementary liquid in Example 3: 1 mmol In(MA), (indium myristate), 0.6 mmol Zn(MA)$_2$ (zinc myristate), 0.8 mmol TMS-P (tris(trimethylsilyl) phosphine), 1.0 mmol trioctylamine and 20.0 g octadecene were added to a 100 mL three-necked flask, and the three-necked flask was heated to 100° C. under $N_2$ venting. The reaction temperature was kept at 100° C. for 30 minutes, and then 0.4 mmol S-ODE was added. The reaction was continued for 10 minutes, and then dropped to room temperature to obtain an InZnPS supplementary liquid.

Example 4

(1) Synthesis of InZnPSe supplementary liquid: 0.5 mmol In(MA)$_3$ (indium myristate), 0.3 mmol Zn(MA)$_2$ (zinc myristate), 0.4 mmol TMS-P (tris(trimethylsilyl) phosphine), 0.5 mmol trioctylamine and 10.0 g octadecene were added to a 100 mL three-necked flask, and the three-necked flask was heated to 40° C. under $N_2$ venting. The reaction temperature was kept at 40° C. for 30 minutes, and then 0.2 mmol Se-ODE was added. The reaction was continued for 10 minutes, and then dropped to room temperature to obtain an InZnPSe supplementary liquid.

(2) Synthesis of InZnPSe quantum dot cores: 0.3 mmol In(Ac), (indium acetate), 1.1 mmol myristic acid and 10.0 g octadecene were added to a 100 mL three-necked flask, and the three-necked flask was heated to 180° C. under $N_2$ venting. The reaction temperature was kept at 180° C. for 30 minutes and then dropped to room temperature. A mixture of 0.2 mmol TMS-P (tris(trimethylsilyl)phosphine) and 0.3 mmol trioctylamine was quickly injected, and then the temperature was raised to 300° C. After reacting at 300° C. for 5 min, the InP core solution was obtained. After keeping the reaction temperature at 300° C., the InZnPSe supplementary liquid was slowly added to the InP core solution dropwise at a rate of 5 mL/h. After the dropping was completed, the mixed solution was reduced to room temperature. The mixed solution containing InZnPSe quantum dots was extracted twice with methanol, precipitated with acetone and centrifuged, and the precipitate was dissolved in ODE to obtain the InZnPSe quantum dot solution, which was subjected to absorption spectrum, photoluminescence emission spectrum and electron microscopy tests.

(3) Synthesis of core-shell quantum dots: 0.8 mmol zinc stearate, 2.4 mmol oleic acid, 0.5 mmol trioctylphosphine and 20.0 g octadecene were added to a 100 mL three-necked flask, and the three-necked flask was heated to 180° C. under $N_2$ venting. The reaction temperature was kept at 180° C. for 30 minutes and then increased to 300° C. The InZnPSe quantum dot solution was injected and reacted for 10 minutes, then 0.3 mmol Se-TOP (selenium-trioctylphosphine) and 0.5 mmol S-TOP (sulfur-trioctyl phosphine) were added and reacted at 300° C. for 30 min, and then dropped to room temperature to obtain a product system containing InZnPSe/ZnSeS. The product system was extracted twice with methanol, precipitated with acetone and centrifuged, and the precipitate was dissolved in toluene, the InZnPSe/ZnSeS quantum dot solution was obtained, and the absorption spectrum, photoluminescence emission spectrum and transmission electron microscope tests were performed.

Example 5

The difference between Example 5 and Example 1 lies in the step (3) synthesis of core-shell quantum dots, while step (1) and step (2) are the same.

The synthesis of core-shell quantum dots in Example 5: 0.8 mmol zinc stearate, 24 mmol oleic acid, 0.5 mmol trioctylphosphine and 20.0 g octadecene were added to a 100 mL three-necked flask, and the three-necked flask was heated to 180° C. under $N_2$ venting. The reaction temperature was kept at 180° C. for 30 minutes and then increased to 300° C. The InZnPS quantum dot solution was injected and reacted for 10 minutes, then 0.8 mmol Se-TOP (selenium-trioctylphosphine) was added and reacted at 300° C. for 30 min, and then dropped to room temperature to obtain a product system containing InZnPS/ZnSe. The product system was extracted twice with methanol, precipitated with acetone and centrifuged, and the precipitate was dissolved in toluene, the InZnPS/ZnSe quantum dot solution was obtained, and the absorption spectrum, photoluminescence emission spectrum and transmission electron microscope tests were performed.

Example 6

The difference between Example 6 and Example 1 lies in the step (3) synthesis of the core-shell quantum dots, while the step (1) and step (2) are the same.

The synthesis of core-shell quantum dots in Example 5: 0.8 mmol zinc stearate, 24 mmol oleic acid, 0.5 mmol trioctylphosphine and 20.0 g octadecene into a 100 mL three-necked flask, and the three-necked flask was heated to 180° C. under $N_2$ venting. The reaction temperature was kept at 180° C. for 30 minutes and then increased to 300° C. The InZnPS quantum dot solution was injected and reacted for 10 minutes, then 0.8 mmol S-TOP (sulfur-trioctyl phosphine) was added and reacted at 300° C. for 30 min, and then dropped to room temperature to obtain a product system containing InZnPS/ZnS. The product system was extracted twice with methanol, precipitated with acetone and centrifuged, and the precipitate was dissolved in toluene, the InZnPS/ZnS quantum dot solution was obtained, and the absorption spectrum, photoluminescence emission spectrum and transmission electron microscope tests were performed.

Example 7

(1) Synthesis of InPS supplementary liquid: 0.8 mmol In(MA)$_3$ (indium myristate), 0.5 mmol TMS-P (tris(trimethylsilyl) phosphine), 0.7 mmol trioctylamine and 15.0 g octadecene were added to a 100 mL three-necked flask, and the three-necked flask was heated to 70° C. under $N_2$ venting. The reaction temperature was kept at 70° C. for 30 minutes, and then 0.4 mmol S-ODE was added. The reaction was continued for 10 minutes, and then dropped to room temperature to obtain an InPS supplementary liquid.

(2) Synthesis of InZnPS quantum dot cores: 0.3 mmol In(Ac)$_3$ (indium acetate), 0.1 mmol Zn(Ach (zinc acetate), 1.3 mmol myristic acid and 10.0 g octadecene were added to a 100 mL three-necked flask, and the three-necked flask was heated to 180° C. under $N_2$ venting. The reaction temperature was kept at 180° C. for 30 minutes and then dropped to room temperature. A mixture of 0.2 mmol TMS-P (tris(trimethylsilyl)phosphine) and 0.3 mmol trioctylamine was quickly injected, and then the temperature was raised to 300° C. After reacting at 300° C. for 5 min, the InZnP core solution was obtained. The reaction temperature was kept at 300° C., and the InPS supplementary liquid was slowly added to the InZnP core solution dropwise at a rate of 5 mL/h. After the dropping was completed, the mixed solution was reduced to room temperature. The mixed solution containing InZnPS quantum dots was extracted twice with methanol, precipitated with acetone and centrifuged, and the precipitate was dissolved in ODE to obtain the InZnPS quantum dot solution, which was subjected to absorption spectrum, photoluminescence emission spectrum and electron microscopy tests.

(3) Synthesis of core-shell quantum dots: 0.8 mmol zinc stearate, 2.4 mmol oleic acid, 0.5 mmol trioctylphosphine and 20.0 g octadecene were added to a 100 mL three-necked flask, and the three-necked flask was heated to 180° C. under $N_2$ venting. The reaction temperature was kept at 180° C. for 30 minutes and then increased to 300° C. The InZnPS quantum dot solution was injected and reacted for 10 minutes, then 0.3 mmol Se-TOP (selenium-trioctylphosphine) and 0.5 mmol S-TOP (sulfur-trioctyl phosphine) were added and reacted at 300° C. for 30 min, and then dropped to room temperature to obtain a product system containing InZnPS/ZnSeS. The product system was extracted twice with methanol, precipitated with acetone and centrifuged, and the precipitate was dissolved in toluene, the InZnPS/ZnSeS quantum dot solution was obtained, and the absorption spectrum, photoluminescence emission spectrum and transmission electron microscope tests were performed.

Comparative Example 1

(1) Synthesis of InZnP supplementary liquid: 0.8 mmol In(MA)$_3$ (indium myristate), 0.5 mmol Zn(MA)$_2$ (zinc myristate), 0.5 mmol TMS-P (tris(trimethylsilyl) phosphine), 0.7 mmol trioctylamine and 15.0 g octadecene were added to a 100 mL three-necked flask, and the three-necked flask was heated to 70° C. under $N_2$ venting. The reaction temperature was kept at 70° C. for 30 minutes and then dropped to room temperature to obtain an InZnP supplementary liquid.

(2) Synthesis of InZnP quantum dot cores: 0.3 mmol In(Ac)$_3$ (indium acetate), 1.1 mmol myristic acid and 10.0 g octadecene were added to a 100 mL three-necked flask, and the three-necked flask was heated to 180° C. under $N_2$ venting. The reaction temperature was kept at 180° C. for 30 minutes and then dropped to room temperature. A mixture of 0.2 mmol TMS-P (tris(trimethylsilyl)phosphine) and 0.3 mmol trioctylamine was quickly injected, and then the temperature was raised to 300° C. After reacting at 300° C. for 5 min, the InP core solution was obtained. The reaction temperature was kept at 300° C., and the InZnP supplementary liquid was slowly added to the InP core solution dropwise at a rate of 5 mL/h. After the dropping was completed, the mixed solution was reduced to room temperature. The mixed solution containing InZnP quantum dots was extracted twice with methanol, precipitated with acetone and centrifuged, and the precipitate was dissolved in ODE to obtain the InZnP quantum dot solution, which was subjected to absorption spectrum, photoluminescence emission spectrum and electron microscopy tests.

(3) Synthesis of core-shell quantum dots: 0.8 mmol zinc stearate, 2.4 mmol oleic acid, 0.5 mmol trioctylphosphine and 20.0 g octadecene were added to a 100 mL three-necked flask, and the three-necked flask was heated to 180° C. under $N_2$ venting. The reaction temperature was kept at 180° C. for 30 minutes and then increased to 300° C. The InZnP quantum dot solution was injected and reacted for 10 minutes, then 0.3 mmol Se-TOP (selenium-trioctylphosphine) and 0.5 mmol S-TOP (sulfur-trioctyl phosphine) were added and reacted at 300° C. for 30 min, and then dropped to room temperature to obtain a product system containing InZnP/ZnSeS. The product system was extracted twice with methanol, precipitated with acetone and centrifuged, and the precipitate was dissolved in toluene, the InZnP/ZnSeS quantum dot solution was obtained, and the absorption spectrum, photoluminescence emission spectrum and transmission electron microscope tests were performed.

Comparative Example 2

(1) Synthesis of InP supplementary liquid: add 0.8 mmol In(MA)$_3$ (indium myristate), 0.5 mmol TMS-P (tris(trimethylsilyl)phosphine), 0.7 mmol trioctylamine and 15.0 g octadecene were added to a 100 mL three-necked flask, and the three-necked flask was heated to 70° C. under $N_2$ venting.

The reaction temperature was kept at 70° C. for 30 minutes and then dropped to room temperature to obtain an InP supplementary liquid.

(2) Synthesis of InZnP quantum dot cores: 0.3 mmol In(Ac)$_3$ (indium acetate), 0.1 mmol Zn(Ac)$_2$ (zinc acetate), 1.3 mmol myristic acid and 10.0 g octadecene were added to a 100 mL three-necked flask, and the three-necked flask was heated to 180° C. under N$_2$ venting. The reaction temperature was kept at 180° C. for 30 minutes and then dropped to room temperature. A mixture of 0.2 mmol TMS-P (tris(trimethylsilyl)phosphine) and 0.3 mmol trioctylamine was quickly injected, and then the temperature was raised to 300° C. After reacting at 300° C. for 5 min, the InZnP core solution was obtained. The reaction temperature was kept at 300° C., and the InP supplementary liquid was slowly added to the InZnP core solution dropwise at a rate of 5 mL/h. After the dropping was completed, the mixed solution was reduced to room temperature. The mixed solution containing InZnP quantum dots was extracted twice with methanol, precipitated with acetone and centrifuged, and the precipitate was dissolved in ODE to obtain the InZnP quantum dot solution, which was subjected to absorption spectrum, photoluminescence emission spectrum and electron microscopy tests.

(3) Synthesis of core-shell quantum dots: 0.8 mmol zinc stearate, 2.4 mmol oleic acid, 0.5 mmol trioctylphosphine and 20.0 g octadecene were added to a 100 mL three-necked flask, and the three-necked flask was heated to 180° C. under N$_2$ venting. The reaction temperature was kept at 180° C. for 30 minutes and then increased to 300° C. The InZnP quantum dot solution was injected and reacted for 10 minutes, then 0.3 mmol Se-TOP (selenium-trioctylphosphine) and 0.5 mmol S-TOP (sulfur-trioctyl phosphine) were added and reacted at 300° C. for 30 min, and then dropped to room temperature to obtain a product system containing InZnP/ZnSeS. The product system was extracted twice with methanol, precipitated with acetone and centrifuged, and the precipitate was dissolved in toluene, the InZnP/ZnSeS quantum dot solution was obtained, and the absorption spectrum, photoluminescence emission spectrum and transmission electron microscope tests were performed.

Comparative Example 3

(1) Synthesis of InZnPS quantum dot cores: 0.3 mmol In(Ac), (indium acetate), 0.1 mmol Zn(Ac)$_2$ (zinc acetate), 1.3 mmol myristic acid and 10.0 g octadecene were added to a 100 mL three-necked flask, and the three-necked flask was heated to 180° C. under N$_2$ venting. The reaction temperature was kept at 180° C. for 30 minutes and then dropped to room temperature. A mixture of 0.2 mmol TMS-P (tris(trimethylsilyl)phosphine), 0.3 mmol trioctylamine and 0.1 mmol S-ODE was quickly injected, and then the temperature was raised to 300° C. After reacting at 300° C. for 5 min, the InZnPS core solution was obtained. The mixed solution containing InZnPS quantum dots was extracted twice with methanol, precipitated with acetone and centrifuged, and the precipitate was dissolved in ODE to obtain the InZnPS quantum dot solution, which was subjected to absorption spectrum, photoluminescence emission spectrum and electron microscopy tests.

(2) Synthesis of core-shell quantum dots: 0.8 mmol zinc stearate, 2.4 mmol oleic acid, 0.5 mmol trioctylphosphine and 20.0 g octadecene were added to a 100 mL three-necked flask, and the three-necked flask was heated to 180° C. under N$_2$ venting. The reaction temperature was kept at 180° C. for 30 minutes and then increased to 300° C. The InZnPS quantum dot solution was injected and reacted for 10 minutes, then 0.3 mmol Se-TOP (selenium-trioctylphosphine) and 0.5 mmol S-TOP (sulfur-trioctyl phosphine) were added and reacted at 300° C. for 30 min, and then dropped to room temperature to obtain a product system containing InZnPS/ZnSeS. The product system was extracted twice with methanol, precipitated with acetone and centrifuged, and the precipitate was dissolved in toluene, the InZnPS/ZnSeS quantum dot solution was obtained, and the absorption spectrum, photoluminescence emission spectrum and transmission electron microscope tests were performed.

The test results of the ultraviolet absorption peak wavelength, half width at half maximum, quantum efficiency, and average particle size of the quantum dot cores of the foregoing Examples and Comparative Examples are shown in Table 1. Ultraviolet absorption spectrometer was used to test the UV absorption peak wavelength and half width at half maximum of the quantum dot cores, and the transmission electron microscope was used to test the average particle size of the quantum dot cores. The detection method of quantum efficiency was as follows: a 450 nm blue LED lamp was used as the backlight spectrum, and integrating sphere was used to test the blue backlight spectrum and the spectrum through the quantum dot solution respectively, and the integrated area of the spectrum was used to calculate the luminous efficiency of the quantum dots. Quantum efficiency=(area of quantum dots emission peak)/(area of blue backlight peak−area of unabsorbed blue peak through quantum dot solution)*100%.

TABLE 1

| | Quantum dot cores | Ultraviolet absorption peak wavelength/ nm | Half width at half maximum/ nm | Quantum efficiency/ % | Average particle size/nm |
|---|---|---|---|---|---|
| Example 1 | InZnPS | 590 | 23.5 | 42.5 | 4.6 |
| Example 2 | InZnPS | 570 | 22.0 | 45.6 | 4.0 |
| Example 3 | InZnPS | 610 | 24.0 | 41.8 | 5.0 |
| Example 4 | InZnPSe | 590 | 22.8 | 39.1 | 4.1 |
| Example 5 | InZnPS | 590 | 23.3 | 43.7 | 4.5 |
| Example 6 | InZnPS | 590 | 23.8 | 42.1 | 4.6 |
| Example 7 | InZnPS | 592 | 24.0 | 40.6 | 4.4 |
| Comparative Example 1 | InZnP | 585 | 32.6 | 10.4 | 3.8 |
| Comparative Example 2 | InZnP | 588 | 35.5 | 6.5 | 3.7 |
| Comparative Example 3 | InZnPS | 590 | 38.0 | 8.5 | 3.6 |

Table 2 shows the test results of the photoluminescence emission peak wavelength, full width at half maximum, quantum efficiency and average particle size of the core-shell quantum dots of the above Examples and Comparative Examples. A photoluminescence emission spectrometer was used to test the photoluminescence emission peak and full width at half maximum of the core-shell quantum dots, and a transmission electron microscope was used to test the average particle size of the quantum dot cores. The detection method of quantum efficiency was as follows: a 450 nm blue LED lamp was used as the backlight spectrum, and integrating sphere was used to test the blue backlight spectrum and the spectrum through the quantum dot solution respectively, and the integrated area of the spectrum was used to calculate the luminous efficiency of the quantum dots. Quantum efficiency=(area of quantum dots emission peak)/ (area of blue backlight peak−area of unabsorbed blue peak through quantum dot solution)*100%.

TABLE 2

| Core-shell quantum dots | | Photoluminescence emission peak wavelength/nm | Full width at half maximum/nm | Quantum efficiency/% | Average particle size/nm |
|---|---|---|---|---|---|
| Example 1 | InZnPS/ZnSeS | 630 | 38.0 | 74.5 | 6.0 |
| Example 2 | InZnPS/ZnSeS | 610 | 37.0 | 75.8 | 5.4 |
| Example 3 | InZnPS/ZnSeS | 650 | 39.0 | 70.6 | 6.5 |
| Example 4 | InZnPSe/ZnSeS | 628 | 38.5 | 70.8 | 5.8 |
| Example 5 | InZnPS/ZnSe | 629 | 37.8 | 72.5 | 6.1 |
| Example 6 | InZnPS/ZnS | 631 | 38.4 | 70.8 | 5.9 |
| Example 7 | InZnPS/ZnSeS | 632 | 39.0 | 71.0 | 5.8 |
| Comparative Example 1 | InZnP/ZnSeS | 625 | 48.5 | 53.0 | 4.6 |
| Comparative Example 2 | InZnP/ZnSeS | 627 | 50.6 | 52.8 | 4.5 |
| Comparative Example 3 | InZnPS/ZnSeS | 629 | 54.0 | 48.5 | 4.2 |

The foregoing Examples are only preferred Examples of the present disclosure, and cannot be used to limit the scope of protection of the present disclosure. Any insubstantial changes and substitutions made by those skilled in the art on the basis of the present disclosure belong to the present disclosure. The scope of protection required.

What is claimed is:

1. A Group II-III-V-VI quantum dot, comprising quantum dot core, wherein the quantum dot core is InZnPS or InZnPSe, an ultraviolet absorption peak wavelength of the quantum dot core is greater than or equal to 570 nanometers and less than or equal to 610 nanometers, and a half width at half maximum of the ultraviolet absorption peak of the quantum dot core is greater than or equal to 22 nanometers and less than or equal to 24 nanometers.

2. The Group II-III-V-VI quantum dot according to claim 1, wherein a size of the quantum dot core is greater than or equal to 4 nanometers and less than or equal to 5 nanometers.

3. The Group II-III-V-VI quantum dot according to claim 1, wherein the quantum dot further comprises a shell layer coating the quantum dot core, the shell layer being selected from one or more of ZnSe, ZnS and ZnSeS, and a photoluminescence emission peak wavelength of the Group II-III-V-VI quantum dot is greater than or equal to 610 nanometers and less than or equal to 650 nanometers, and a photoluminescence full width at half maximum of the Group II-III-V-VI quantum dot is greater than or equal to 37 nanometers and less than or equal to 39 nanometers.

4. The Group II-III-V-VI quantum dot according to claim 2, wherein the quantum dot further comprises a shell layer coating the quantum dot core, the shell layer being selected from one or more of ZnSe, ZnS and ZnSeS, and a photoluminescence emission peak wavelength of the Group II-III-V-VI quantum dot is greater than or equal to 610 nanometers and less than or equal to 650 nanometers, and a photoluminescence full width at half maximum of the Group II-III-V-VI quantum dot is greater than or equal to 37 nanometers and less than or equal to 39 nanometers.

5. A method for preparing Group II-III-V-VI quantum dots, comprising the following steps:
S1, providing a first solution containing Group III-V quantum dot cores, or providing a second solution containing Group II-III-V quantum dot cores;
S2, adding a second supplementary liquid to the first solution, or adding a first supplementary liquid to the second solution, and reacting to obtain Group II-III-V-VI quantum dot cores;
wherein, a preparation method of the first supplementary liquid comprises: reacting a first mixture comprising a precursor of a first Group III element, a precursor of a first Group V element and a solvent at a temperature of 40~100° C., and then adding a precursor of a first Group VI element and reacting to obtain the first supplementary liquid; or
a preparation method of the second supplementary liquid comprises: reacting a second mixture comprising a precursor of a first Group II element, a precursor of a first Group III element, a precursor of a first Group V element and a solvent at a temperature of 40~100° C., and then adding a precursor of a first Group VI element and reacting to obtain the second supplementary liquid.

6. The method for preparing the Group II-III-V-VI quantum dots according to claim 5, wherein the reaction temperature of step S2 is 250~300° C.

7. The method for preparing the Group II-III-V-VI quantum dots according to claim 5, wherein the Group III-V quantum dot cores are InP, and the Group II-III-V quantum dot cores are InZnP.

8. The method for preparing the Group II-III-V-VI quantum dots according to claim 5, wherein, in the first supplementary liquid, a mole ratio of the first Group III element with respect to the first Group V element is greater than or equal to 1:1 and less than or equal to 10:1, and a mole ratio of the first Group III element with respect to the first Group VI element is greater than or equal to 1:2 and less than or equal to 5:1.

9. The method for preparing the Group II-III-V-VI quantum dots according to claim 5, wherein, in the second supplementary liquid, a mole ratio of the first Group III element with respect to the first Group II element is greater than or equal to 1:5 and less than or equal to 10:1, a mole ratio of the first Group III element with respect to the first Group V element is greater than or equal to 1:1 and less than or equal to 10:1, and a mole ratio of the first Group III element with respect to the first Group VI element is greater than or equal to 1:2 and less than or equal to 5:1.

10. The method for preparing the Group II-III-V-VI quantum dots according to claim 5, wherein the precursor of the first Group II element is a zinc precursor, the precursor of the first Group III element is an indium precursor, the precursor of the first Group V element is a phosphorus precursor, and the precursor of the first Group VI element is one of a selenium precursor and a sulfur precursor.

11. The method for preparing the Group II-III-V-VI quantum dots according to claim 5, wherein the first mixture or the second mixture further comprises a ligand, and the ligand is selected from one or more of trioctylamine, trioctylphosphine, tributylphosphine, dioctylamine and octylamine.

12. The method for preparing the Group II-III-V-VI quantum dots according to claim 5, wherein, after the step S2, further comprises the following step: purifying the Group II-III-V-VI quantum dot cores of the step S2 and dissolving it in a solvent, adding a precursor of a second Group II element and a precursor of a second Group VI element to a solution containing the Group II-III-V-VI quantum dot cores, reacting for a period of time to coat the Group II-III-V-VI quantum dot core with a Group II-VI shell layer, and then purifying the prepared quantum dots from the solution.

13. The method for preparing the Group II-III-V-VI quantum dots according to claim 12, wherein the precursor of the second Group II element is a zinc precursor, and the precursor of the second Group VI element is one of a sulfur precursor, a selenium precursor and a selenium-sulfur mixed precursor.

14. The method for preparing the Group II-III-V-VI quantum dots according to claim 6, wherein, after the step S2, further comprises the following step: purifying the Group II-III-V-VI quantum dot cores of the step S2 and dissolving it in a solvent, adding a precursor of a second Group II element and a precursor of a second Group VI element to a solution containing the Group II-III-V-VI quantum dot cores, reacting for a period of time to coat the Group II-III-V-VI quantum dot core with a Group II-VI shell layer, and then purifying the prepared quantum dots from the solution.

15. The method for preparing the Group II-III-V-VI quantum dots according to claim 7, wherein, after the step S2, further comprises the following step: purifying the Group II-III-V-VI quantum dot cores of the step S2 and dissolving it in a solvent, adding a precursor of a second Group II element and a precursor of a second Group VI element to a solution containing the Group II-III-V-VI quantum dot cores, reacting for a period of time to coat the Group II-III-V-VI quantum dot core with a Group II-VI shell layer, and then purifying the prepared quantum dots from the solution.

16. The method for preparing the Group II-III-V-VI quantum dots according to claim 10, wherein, after the step S2, further comprises the following step: purifying the Group II-III-V-VI quantum dot cores of the step S2 and dissolving it in a solvent, adding a precursor of a second Group II element and a precursor of a second Group VI element to a solution containing the Group II-III-V-VI quantum dot cores, reacting for a period of time to coat the Group II-III-V-VI quantum dot core with a Group II-VI shell layer, and then purifying the prepared quantum dots from the solution.

17. A quantum dot optoelectronic device, wherein the quantum dot optoelectronic device comprises the quantum dot according to claim 1.

18. The quantum dot optoelectronic device according to claim 17, wherein a size of the quantum dot core is greater than or equal to 4 nanometers and less than or equal to 5 nanometers.

19. The quantum dot optoelectronic device according to claim 17, wherein the quantum dot further comprises a shell layer coating the quantum dot core, the shell layer being selected from one or more of ZnSe, ZnS and ZnSeS, and a photoluminescence emission peak wavelength of the Group II-III-V-VI quantum dot is greater than or equal to 610 nanometers and less than or equal to 650 nanometers, and a photoluminescence full width at half maximum of the Group II-III-V-VI quantum dot is greater than or equal to 37 nanometers and less than or equal to 39 nanometers.

20. A quantum dot optoelectronic device, wherein the quantum dot optoelectronic device comprises the quantum dots prepared by the method for preparing Group II-III-V-VI quantum dots according to claim 5.

* * * * *